United States Patent

Gotoh

(10) Patent No.: US 7,359,262 B2
(45) Date of Patent: Apr. 15, 2008

(54) SEMICONDUCTOR MEMORY DEVICE

(75) Inventor: Yasuo Gotoh, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 181 days.

(21) Appl. No.: 11/436,419

(22) Filed: May 17, 2006

(65) Prior Publication Data

US 2006/0262615 A1    Nov. 23, 2006

(30) Foreign Application Priority Data

May 18, 2005   (JP)   ............................. 2005-145682

(51) Int. Cl.
*G11C 7/00*   (2006.01)
(52) U.S. Cl. ...................... 365/200; 365/201
(58) Field of Classification Search .............. 365/200, 365/201
See application file for complete search history.

(56) References Cited

U.S. PATENT DOCUMENTS 5,657,281 A     8/1997  Rao
6,144,592 A *  11/2000  Kanda ......................... 365/200
2003/0095449 A1* 5/2003  Kato ........................... 365/200

FOREIGN PATENT DOCUMENTS

JP          10-27138 A       1/1998
JP       2001-256793 A       9/2001

* cited by examiner

*Primary Examiner*—Anh Phung
(74) *Attorney, Agent, or Firm*—Morrison & Foerster LLP

(57) ABSTRACT

A semiconductor memory device according to the present invention where the entire memory area determined by an array of memory cells is divided into a plurality of memory areas comprises at least one relief memory area for redundancy relieving a fault memory area which contains a fault memory cell, a fault address storing means in which a fault address is stored, a comparator circuit for comparing an address of the memory area specified by an input address with the fault address and when the input address corresponds to the fault address, selecting the corresponding relief memory area, wherein the comparator circuit selects the corresponding relief memory area upon receiving from the outside a relief memory area select signal indicative of selection of the relief memory area even when the address of the memory area specified by the address input does not correspond to the fault address.

3 Claims, 7 Drawing Sheets

| Chip Number C | Fault Block Address A |
|---|---|

Fig. 5a

| O | Address of Block B4 |
|---|---|

Fig. 5b

SEMICONDUCTOR MEMORY DEVICE

CROSS REFERENCE TO RELATED APPLICATION

This Nonprovisional application claims priority under 35 U.S.C. §119(a) on Patent Application No. 2005-145682 filed in Japan on May 18, 2005, the entire contents of which are hereby incorporated by reference.

BACKGROUND OF THE INVENTION

1. Field of the Invention

The present invention relates to a technology for relieving the fault memory area in a semiconductor memory device which is not correctly conductive and particularly to a redundancy relief technology for two or more semiconductor memory devices assembled in a single package.

2. Description of the Related Art

A semiconductor memory device having at least an array of memory cells arranged in a row-and-column matrix may produce a fault in units of memory cells, rows, columns, or memory blocks which consists of rows and columns. In order to increase the productivity of a storage apparatus, there hence have been proposed and known a variety of relief technologies for the fault memory areas (referred to as relief units).

One type of the known relief technologies is a redundancy relief technology. The redundancy relief technology is arranged in which an array of memory cells are accompanied with a desired number of redundancy rows or columns. This allows any fault row or column including a fault memory cell(s) or any entirely fault row or column to be replaced by the redundancy row or column. More particularly, the address of a fault row or column has been stored in a fault address storing means and read out for comparison with the input address received from the outside. When the input address corresponds to the address of the fault row or column saved in the fault address storing means, its relevant redundancy row or column can automatically be picked up for replacement.

Another redundancy relief technology may be provided as known a block redundancy relief technology where a fault memory block comprising a number of the memory cells is replaced by the redundancy block.

More particularly, the block redundancy relief technology permits the address of a fault block to be saved in each semiconductor memory device in advance, as shown in FIG. 6. In addition, as the input address has been received from the outside, its block address is compared with the address of the fault block saved in the fault address storing means. Then, when the two addresses are equal, their corresponding redundancy block is automatically selected.

The semiconductor memory device shown in FIG. 6 will now be explained which includes a group of memory blocks B1 to B4 and a redundancy block B5, assuming that the memory block B2 is a fault block. The address of the memory block B2 is saved as a fault block address in the fault address storing means 71 in advance. When the address input is received at an address buffer 72, its block address is transferred to an address matching circuit 73 where it is compared with the fault block address saved in the fault address storing means 71. When the block address in the input address corresponds to the fault block address, the action of an address decoder 74 for selecting the memory block B2 is canceled and the redundancy block select signal RS is released for selecting the redundancy block B5. If there is discrepancy between the two addresses, the address decoder 74 releases a decoded signal for selecting the memory block B2. This signal allows the selection of the block determined by the address received at the address buffer 72 and disables the redundancy block select signal RS for selection of the redundancy block. The fault address storing means 71 is implemented by a non-volatile memory which is fusible or electrically re-writable.

FIG. 7 illustrates an arrangement of the storage apparatus including a pair of semiconductor memory devices 7a and 7b, such as shown in FIG. 6, and an external controller 6. Any of the two semiconductor memory devices 7 is selectively enabled for operation. If one of the two semiconductor memory devices 7 contains two or more fault blocks, it can replace only one fault block with its single redundancy block and thus its usable memory capacity is decreased. Consequently, with the other semiconductor memory device 7 containing no fault block and remaining at no use of its redundancy block, the storage apparatus will save seven blocks to be applicable out of all the ten blocks.

Also, a further redundancy relief technology is disclosed in the form of a semiconductor memory device which includes an address translating circuit for fixedly translating the address from the fault block to the redundancy block (See Japanese Patent Laid-open Publication No. 2001-256793, for example). When receiving the address of a fault block from the outside, the disclosed semiconductor memory device instructs its address translating circuit to translate the address from the fault block to the redundancy block for selecting and permitting the redundancy block to replace the fault block. The semiconductor memory device aims to prevent the increase of the chip size due to the fuse circuit and the access time.

However, the redundancy relief technology disclosed in the Publication, No. 2001-256793, is not advantageous because no more of the fault blocks than the number of redundancy blocks prepared in each semiconductor memory device can be relieved. When any one of the semiconductor memory devices assembled in a single package contains more fault blocks than the number of redundancy blocks, the package itself will be judged and discarded as a fault package.

A modification is proposed in the form of a semiconductor memory device which includes a group of memory units, each comprising a number of memory blocks and a redundancy block, and a controller for translating the address from the fault block in each memory unit to the redundancy block (as disclosed in, e.g., Japanese Patent Laid-open Publication No. (Heisei)10-27138). The modified redundancy relief technology is designed for controlling the entire of each memory unit as a whole, where the relief action is made on the block-by-block basis.

While the semiconductor memory device disclosed in the Publication No. (Heisei)10-27138) permits the redundancy blocks saved in the other semiconductor memory devices to be effectively utilized for replacement since its controlling action is based on the entirety of each memory unit, it has however to translate the address from each of the fault blocks to the redundancy block. This will increase the access time for translating of the address and also make the redundancy relief circuit troublesome in the fabrication. Recently, since a plurality of the semiconductor memory devices are commonly assembled in a single package, it is now desired that the redundancy relief technology is improved for increasing the productivity and simplifying the algorithm of the redundancy relief.

SUMMARY OF THE INVENTION

The present invention has been developed in view of the foregoing aspects and its object is to provide a redundancy relief technology for increasing the productivity and simplifying the algorithm of the redundancy relief while utilizing the redundancy relief memory areas in the other semiconductor memory devices being not used.

For achievement of the above object, a semiconductor memory device according to the present invention includes at least an array of memory cells arranged in a row and column matrix, where the entire memory area determined by the array of the memory cells is divided into a plurality of memory areas. The semiconductor memory device further includes at least one relief memory area for redundancy relieving a fault memory area which contains a fault memory cell when the fault memory cell exists in the certain memory area, a fault address storing means in which a fault address specifying the fault memory area is stored, a comparator circuit for comparing an address of the memory area determined by an input address with the fault address and when the input address corresponds to the fault address, selecting the corresponding relief memory area. Even when the address of the memory area specified by the address input does not correspond to the fault address stored in the fault address storing means, the comparator circuit selects the corresponding relief memory area upon receiving from the outside a relief memory area select signal indicative of selection of the relief memory area.

For achievement of the above object, an external controller according to the present invention is provided for delivering the relief memory area select signal to each of the semiconductor memory devices. The external controller comprises a specific fault address storage for storing a specific fault address which specifies the fault memory area in each of the semiconductor memory devices to be replaced by the relief memory area stored in another semiconductor memory device, a comparator for comparing the input address with each of the specific fault address stored in the specific fault address storage and when the input address corresponds to the specific fault address, delivering the relief memory area select signal to the other semiconductor memory device which contains the corresponding relief memory area, and a select signal generator for, when the input address corresponds to the specific fault address, delivering a chip select signal to the other semiconductor memory device which contains the corresponding relief memory area.

For achievement of the above object, a storage apparatus according to the present invention comprises a plurality of the semiconductor memory devices and the external controller.

According to the present invention, the semiconductor memory device allows its relief memory area to be selectively picked up by the relief memory area select signal for selecting its relief memory area received from the outside. As the result, the relief memory area remaining not used can be utilized favorably in each device while no translation of the address is required. As the duration of time required for the translation of the address is eliminated, the redundancy relief algorithm can be simplified. Also, since the semiconductor memory device according to the present invention is operable independently, it can be increased in the range of the application and permit the storage apparatus according to the present invention to be improved in the freedom of design.

BRIEF DESCRIPTION OF THE DRAWINGS

FIGS. 5a and 5b are a schematic view of a data structure in specific fault address storage according to the present invention;

DETAILED DESCRIPTION OF THE INVENTION

A storage apparatus (referred to as an inventive apparatus hereinafter), a semiconductor memory device, and an external controller will be described in the form of embodiments of the present invention will be described referring to the relevant drawings.

First Embodiment

Figure 1:
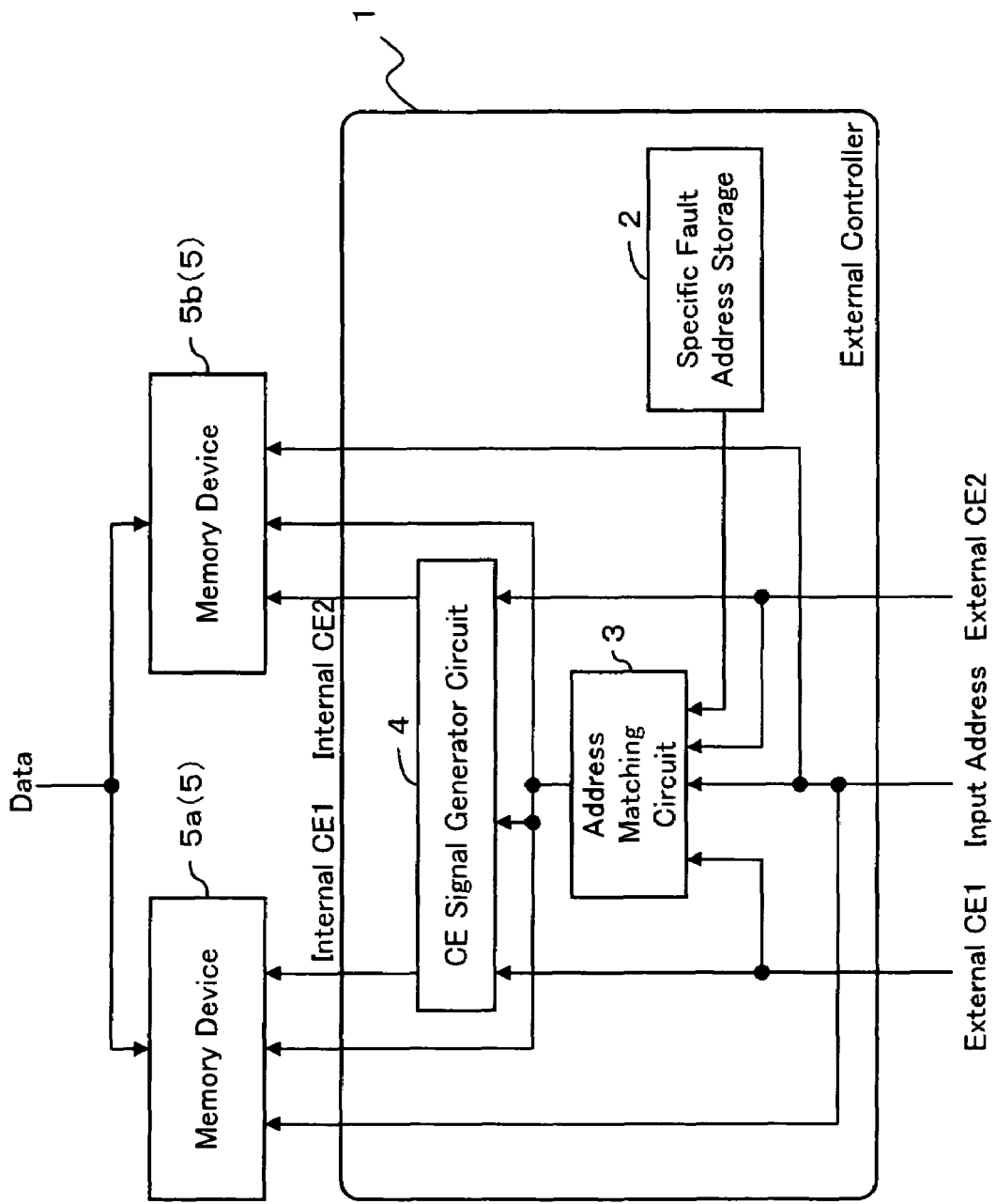
FIG. 1 is a block diagram of a storage apparatus showing one embodiment of the present invention.

The inventive apparatus of the first embodiment comprises a plurality of semiconductor memory devices 5 and an external controller 1, as shown in FIG. 1. In this embodiment, it is now assumed that one package includes two semiconductor memory devices 5a and 5b, and a fault block which fails to be replaced in one of the two semiconductor memory devices 5 is replaced by a redundancy block in the other of the two semiconductor memory devices 5.

A construction of the semiconductor memory device 5 according to the present invention will first be described referring to FIG. 2.

The semiconductor memory device 5 includes at least one array of memory cells arranged in a row-and-column matrix. More particularly, the semiconductor memory device 5 comprises a group of memory blocks B1 to B4 as the arrays of memory cells, a redundancy block B5 acting as the relief memory area, a fault address storing means 51, and an address matching circuit 53 acting as a comparator circuit. The semiconductor memory device 5 in this embodiment comprises an address buffer 52, an address decoder 54, a sense amplifier 55, and an output buffer 56 for operating the fundamental functions of the semiconductor memory device 5. The semiconductor memory device 5 commonly receives an external address signal and a relief memory area select signal and independently receives a CE signal which acts as a chip select signal.

Figure 2:
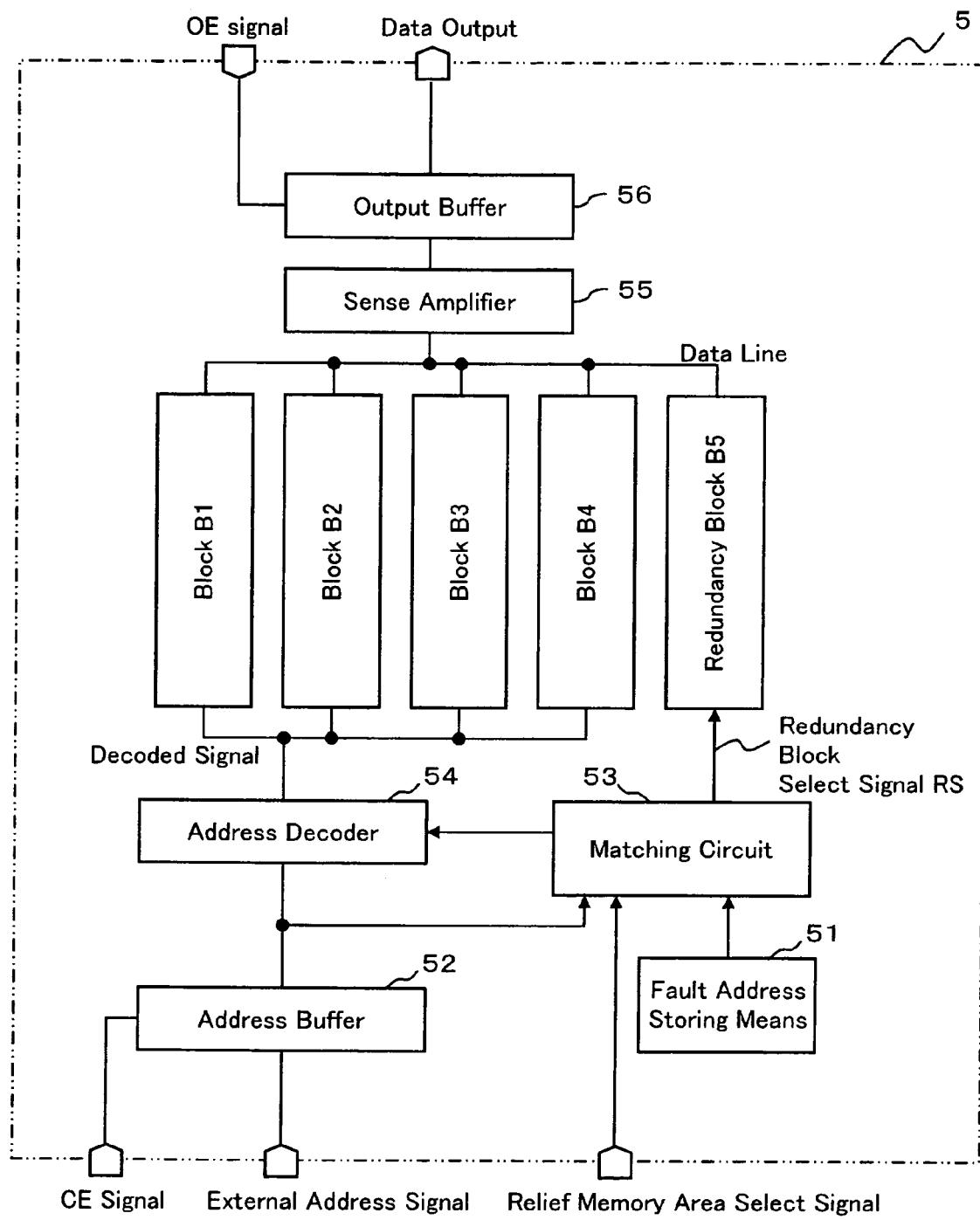
FIG. 2 is a block diagram of a semiconductor memory device showing another embodiment of the present invention.

As shown in FIG. 2, the semiconductor memory device 5 of the embodiment has the four blocks B1 to B4 accompanied with the single redundancy block B5. The single redundancy block B5 is identical in the size to each of the four blocks B1 to B4 and can thus be replaced by any fault containing one of the four blocks B1 to B4. This description of the redundancy relief technology on the block-by-block basis will hence be made with any fault containing block (memory area) to be replaced by the redundancy block B5.

It is noted that the semiconductor memory device 5 has been subjected to a function test and its test result determines the fault address for specifying a fault memory block where a fault memory cell exists. It is then assumed that the blocks B2 and B4 are found as fault blocks in the semiconductor memory device 5*a* while no fault exists in the other semiconductor memory device 5*b*.

The fault address storing means 51 saves the fault address of locating each fault memory area. The fault address presents an address determined by the function test. The fault address storing means 51 in the semiconductor memory device 5*a* saves the fault address of one of the two blocks B2 and B4 (or example, the block B2 in this embodiment) to be replaced by the redundancy block B5. The address of the other fault block (the block B4) is temporarily saved in a tester employed for the function test or any array of memory cells of the semiconductor memory devices 5*a* and 5*b* before duly registered in a specific fault address storage 2 of the external controller 1. No fault address is saved in the fault address storing means 51 of the semiconductor memory device 5*b*.

The address matching circuit 53 is arranged to select the redundancy block B5 upon receiving from the outside the relief memory area select signal which indicates the section of the redundancy block B5 (a relief memory area), regardless of discrepancy between the address of a memory block determined by the address input and the fault address saved in the fault address storing means 51. The address matching circuit 53 operates the known action of redundancy relief function, that is, comparison between the address of a memory block determined by the input address and the fault address and selection of the redundancy block B5 when the two are identical.

The action of the semiconductor memory device 5 will be described referring to FIG. 2.

When the CE signal (chip select signal) is turned to "1" with the relief memory area select signal remaining at "1", the address matching circuit 53 in the semiconductor memory device 5 releases a redundancy block select signal RS for selecting the redundancy block B5 regardless of the block address input. Alternatively, when the CE signal is turned to "1" with the relief memory area select signal remaining at "0", the address matching circuit 53 selects the memory block determined by the block address input from the address decoder 54. When finding that the selected block is identical to the fault block saved in the fault address storing means 51, the address matching circuit 53 releases the redundancy block select signal RS for replacing the selected block with the redundancy block B5.

More specifically, the block B2 in the semiconductor memory device 5*a* is replaced by the redundancy block B5 in the semiconductor memory device 5*a* by the known manner while the block B4 in the semiconductor memory device 5*a* is replaced by not the redundancy block B5 in the semiconductor memory device 5*a* but the redundancy block B5 in the other semiconductor memory device 5*b*.

When receiving the CE signal of "1" and the block address indicative of B1 or B3, the semiconductor memory device 5*a* enables the memory blocks B1 or B3 to be read out or written with a data by any other control signal such as an OE signal commanding the output of data from the semiconductor memory device 5 or a WE signal (not shown) commanding the input of data from the semiconductor memory device 5. On the other hand, when receiving the CE signal of "1" and the block address indicative of B2 which is a fault block, the semiconductor memory device 5*a* disables the memory block B2 but enables the redundancy memory blocks B5 to be read out or written with a data. This permits the semiconductor memory device 5*a* to be correctly read out or written with a data, except the memory block B4, in response to an external read-out or write-in command.

The semiconductor memory device 5*b* selects the relief memory area (the redundancy block B5) when the relief memory area select signal is at "1" regardless of discrepancy between the input address and the fault address saved in the fault address storing means 51. More specifically, when the CE signal (the chip select signal) is turned to "1" with the relief memory area select signal of "1", the address matching circuit 53 releases the redundancy block select signal RS for selection of the redundancy block B5.

The semiconductor memory device 5*b* operates a common action when the relief memory area select signal is at "0". More specifically, when receiving the block address indicative of any of the memory blocks B1 to B4 with the CE signal of "1", the semiconductor memory device 5*b* enables the memory block determined by the block address to be read out or written with a data in response to the input of any other control signal such as the OE signal or the WE signal (not shown).

The action of the external controller 1 according to the present invention will now be described referring to FIGS. 1, 3, and 4. The external controller 1 is separately fabricated and then assembled together with the two semiconductor memory devices 5*a* and 5*b* as surface mounted and wired in the same package. Alternatively, the external controller 1 may be pre-installed in the storage apparatus during the manufacturing process.

The external controller 1 is arranged to deliver the relief memory area select signal to each of the semiconductor memory devices 5*a* and 5*b* separately as including a specific fault address storage 2, an address matching circuit 3 which acts as a comparator, and a CE signal generator circuit 4 which acts as a select signal generator.

The specific fault address storage 2 comprises an array of nonvolatile memory cells such as mask ROM cells, EEPROM cells, or fusible ROM cells for storage of the specific fault address indicating a specific memory area which assigns the relief memory area in the other of the two semiconductor memory devices 5. Once a fault block has been determined through the function test of the semiconductor memory devices 5, its address is saved in the specific fault address storage 2. Before the specific fault address is saved in the specific fault address storage 2 after the function test of the semiconductor memory devices 5*a* and 5*b*, it is temporarily held in the tester or either of the two semiconductor memory devices 5*a* and 5*b*.

More particularly, the specific fault address to be saved in the specific fault address storage 2 includes a chip number C and its address A where the fault block exits as is to be replaced by the redundancy block B5 in the other semiconductor memory device 5. FIG. 5*a* illustrates a data structure of the specific fault address storage 2 where the chip number C is saved as the uppermost bits while the address A is saved as the lowermost bits in a non-volatile manner. Since the two semiconductor memory devices 5 are provided in a pair in the embodiment, the data length of the chip number C is one bit. The chip number C saved in the relief address storage 2 is zero, C=0, when the semiconductor memory device 5*a* contains a fault block. Alternatively, the chip number C is one, C=1, when the semiconductor memory device 5*b* contains a fault block.

Since the block B4 in the semiconductor memory device 5*a* is replaced for relief by the redundancy block B5 in the semiconductor memory device 5*b*, the specific fault address storage 2 in this embodiment has a field filled with the chip number C at "0" and a field filled with the fault block address A indicating the address of the block B4, as shown in FIG. 5b.

The address matching circuit 3 compares the input address with the specific fault address saved in the specific fault address storage 2 and when the input address corresponds to the specific fault address, delivers the relief memory area select signal to the semiconductor memory device 5 which has the redundancy block B5 (the relief memory area).

Figure 3:
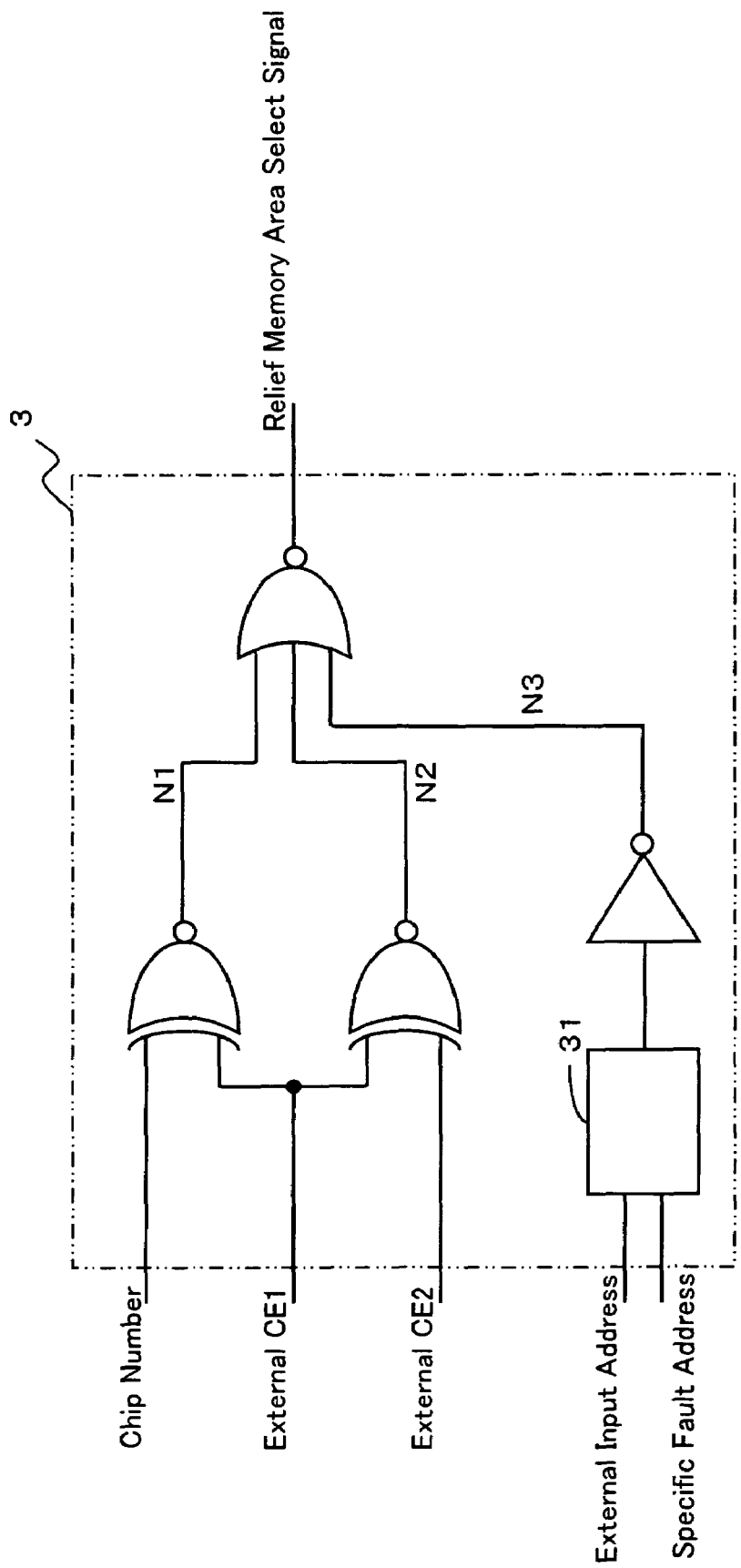
FIG. 3 is a circuitry diagram of an address matching circuit in the storage apparatus according to the present invention.

FIG. 3 illustrates a specific arrangement of the address matching circuit 3. As shown in FIG. 3, the address matching circuit 3 includes a comparator 31 which releases a signal of "1" when the external input address corresponds to the specific fault address received from the specific fault address storage 2 and a signal of "0" when not. When the input address received from the outside is indicative of the address of the block B4 in the semiconductor memory device 5a, the output of the comparator 31 in the address matching circuit 3 is at "1".

Also when receiving an external CE1 signal, an external CE2 signal, a chip number, and an external input address along with the signal from the specific fault address storage 2, the address matching circuit 3 delivers the relief memory area select signal. In fact, when the fault block is selected to be replaced with the redundancy block B5 in the other semiconductor memory device 5 from the examination of the external CE1 signal, the external CE2 signal, the chip number, and the external input address, the relief memory area select signal is released.

Then, the action of the address matching circuit 3 will be described in more detail referring to FIG. 3. When the fault block to be replaced by the redundancy block B5 in the semiconductor memory device 5b is found in the semiconductor memory device 5a with the chip number C of the specific fault address saved in the specific fault address storage 2 remaining at "0", both the nodes N1 and N2 are turned to "0" with the external CE1 signal at "1" and the external CE2 signal at "0". Also, when the external input address corresponds to the specific fault address received from the specific fault address storage 2, the output of the comparator 31 is turned to "1" thus establishing the node N3 at "0" and the relief memory area select signal at "1". Similarly, when the fault block to be replaced by the redundancy block B5 in the semiconductor memory device 5a is found in the semiconductor memory device 5b with the chip number C of the specific fault address saved in the specific fault address storage 2 remaining at "1", both the nodes N1 and N2 are turned to "0" with the external CE1 signal at "0" and the external CE2 signal at "1". Also, when the external input address corresponds to the specific fault address received from the specific fault address storage 2, the output of the comparator 31 is turned to "1" thus establishing the node N3 at "0" and the relief memory area select signal at "1". In either case, when both the external CE1 signal and the external CE2 signal are at "0", the relief memory area select signal is at "0".

In this embodiment, when the external CE1 signal received by the semiconductor memory device 5a is at "1" and the external CE2 signal received by the semiconductor memory device 5b is at "0" with the external input address indicating the address of the block B4 in the semiconductor memory device 5a, the relief memory area select signal is released at "1". More specifically, when the external CE1 signal and the external CE2 signal are at "1" and "0" respectively with the chip number C remaining at "0", both the nodes N1 and N2 are turned to "0". With the external input address indicating the address of the block B4 in the semiconductor memory device 5a, the output of the comparator 31 is at "1" thus establishing the node N3 at "0" and the relief memory area select signal at "1".

When informed by the address matching circuit 3 that the input address corresponds to the specific fault address, the CE signal generator circuit 4 delivers the chip select signal to the semiconductor memory device 5 having the redundancy block 5B.

Figure 4:
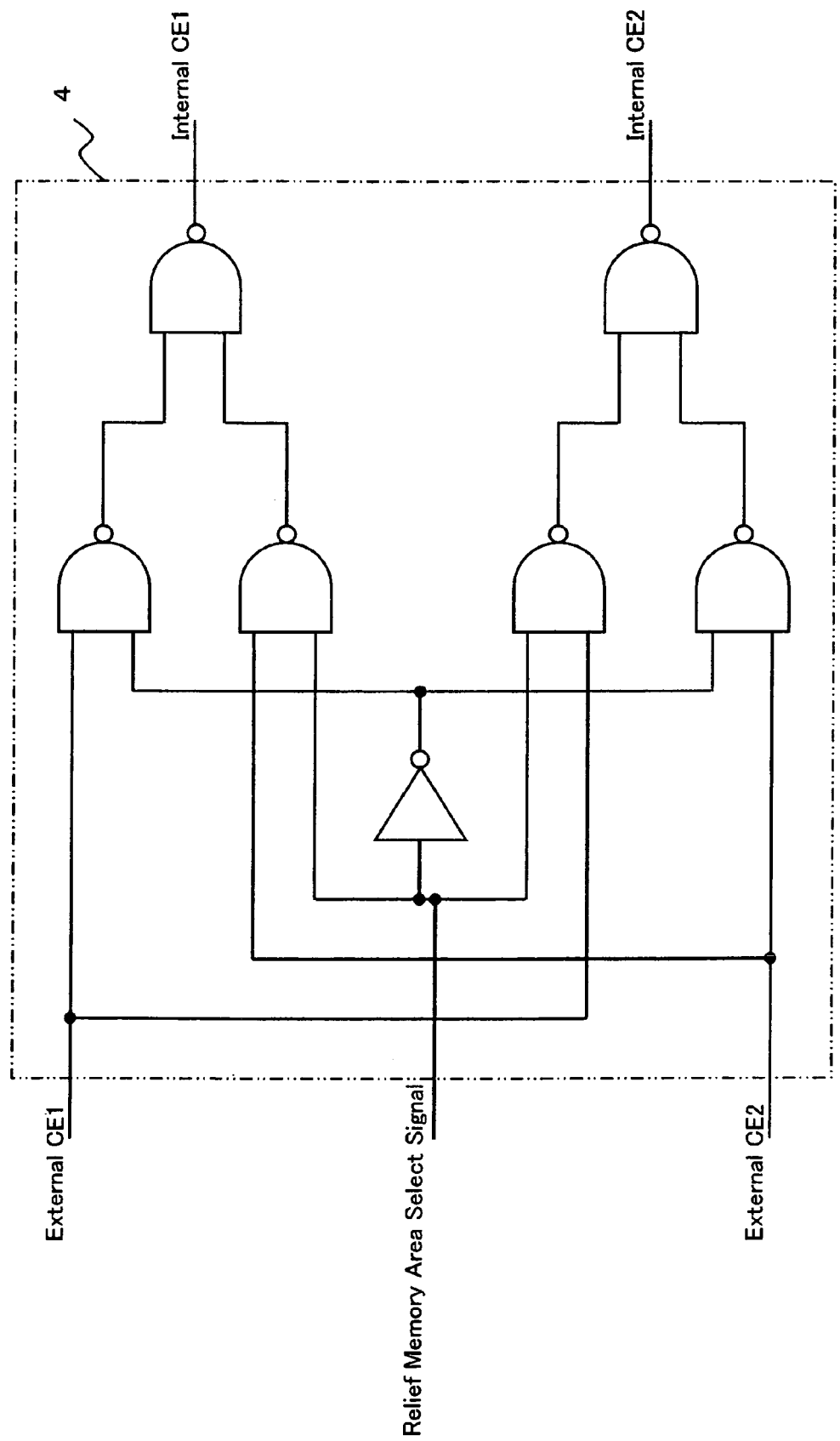
FIG. 4 is a circuitry diagram of a CE select signal generator circuit in the storage apparatus according to the present invention.
Figure 6:
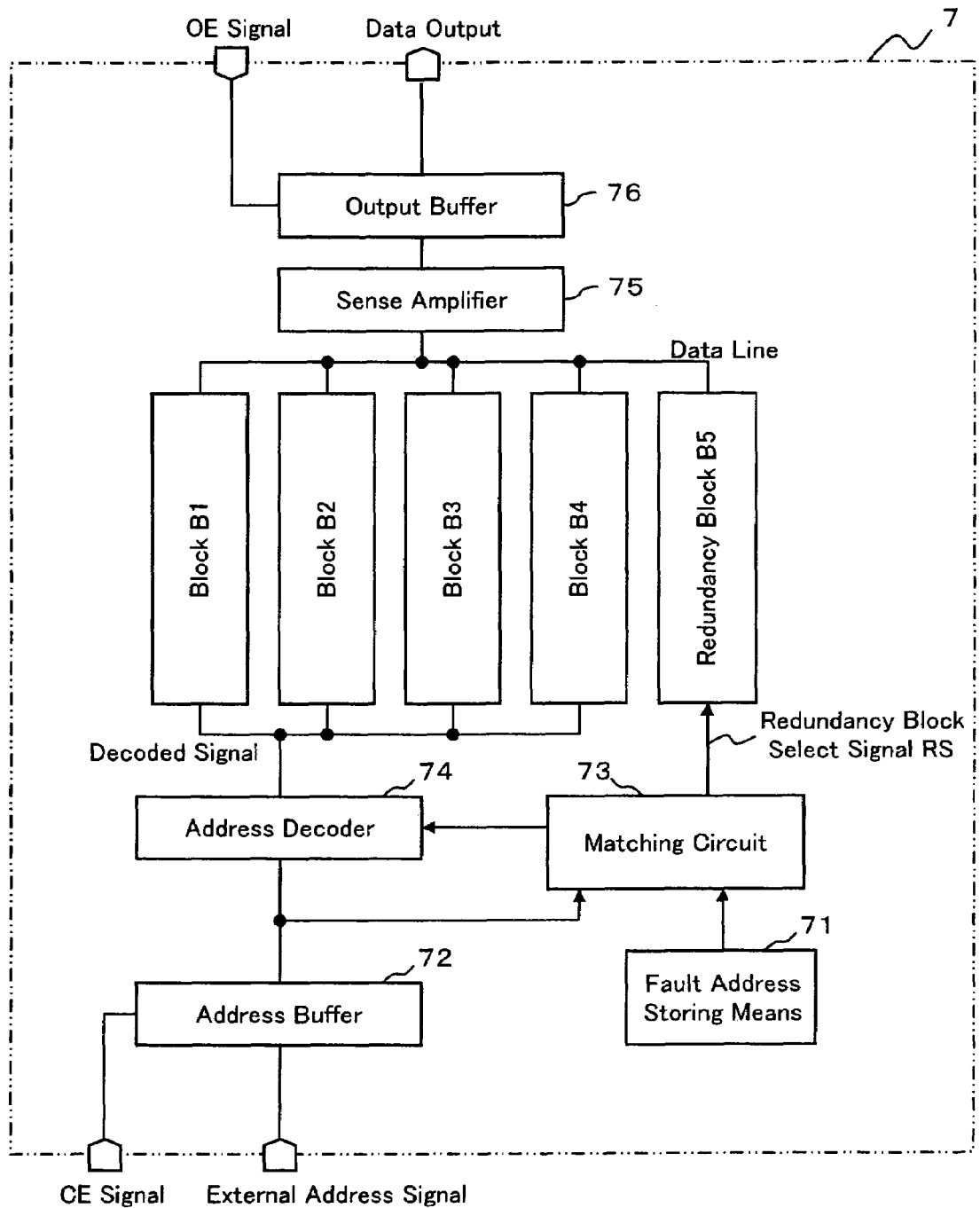
FIG. 6 is a block diagram of a semiconductor memory device according to the conventional technique.
Figure 7:
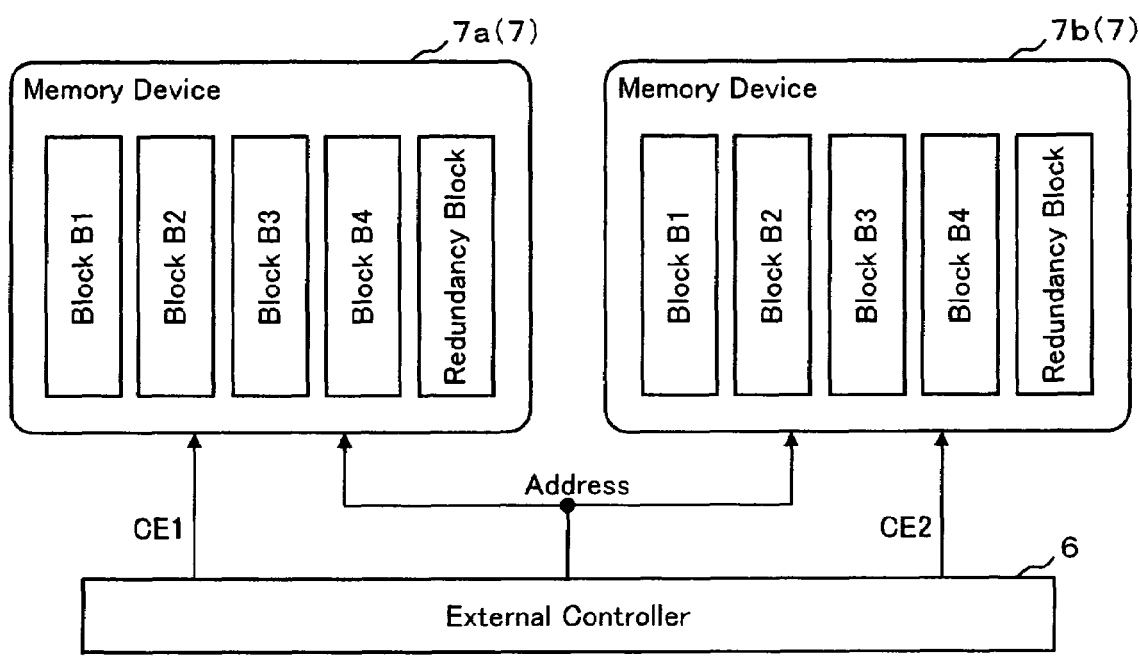
FIG. 7 is a block diagram of a storage apparatus according to the conventional technique.

FIG. 4 illustrates a specific arrangement of the CE signal generator circuit 4. As shown in FIG. 4, the CE signal generator circuit 4 in the embodiment passes directly the external CE1 signal and the external CE2 signal therethrough as an internal CE1 signal and an internal CE2 signal respectively when the relief memory area select signal is at "0". When the relief memory area select signal is at "1", the external CE1 signal and the external CE2 signals are released as an internal CE2 signal and an internal CE2 signal respectively.

The relief memory area select signal is indicative of selecting the fault memory block in one of the two semiconductor memory devices 5 to be replaced by the redundancy block B5 in the other semiconductor memory device 5 and thus received by each of the semiconductor memory devices 5. The redundancy block B5 which is saved and remains unused in the semiconductor memory device 5 (5b in this embodiment) can be selected only when the relief memory area select signal is received along with the CE signal. This allows the two semiconductor memory devices 5 to be used alternatively.

Another Embodiment

Another embodiment of the present invention will be described in the form of apparatus and method.

(1) The semiconductor memory devices 5 are identical in the number of the memory blocks, but not limited, to each other in the previous embodiment. Similarly, the semiconductor memory devices 5 are identical in the number of the redundancy blocks, but not limited, to each other. The present invention allows each of the semiconductor memory devices 5 to include a desired number of the memory blocks as well as a desired number of the redundancy blocks depending on the construction and function of the storage apparatus.

In case that the semiconductor memory device 5 has more than one of the redundancy blocks, the relief memory area select signal may carry a number of bits enough to identify and select each of the redundancy blocks from the semiconductor memory device 5.

(2) The present invention is intended for, but not limited to, the relief of each memory block or on the block-by-block basis with the use of the redundancy block. Alternatively, the relief of each row or each column may be made using a redundancy row or redundancy column respectively. In the latter case, the address and chip number for identifying the fault row or column is saved in the specific fault address storage 2 of the external controller 1. When receiving the input address indicating the fault row or column to be replaced by the relief memory area in the other semiconductor memory device 5, the external controller 1 delivers the chip select signal and the relief memory area select signal to the other semiconductor memory device 5 which has the relief memory area arranged to replace the fault row or column. Accordingly, the redundancy row or column saved in the relief memory area of the other semiconductor memory device 5 can selectively be picked up for replacing the fault row or column.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
    an array of memory cells arranged in a row and column matrix;
    at least one relief memory area for redundancy relieving a fault memory area which contains a fault memory cell when the entire memory area determined by the array of the memory cells is divided into a plurality of memory areas and the fault memory cell exists in the certain memory area;
    a fault address storing means in which a fault address specifying the fault memory area is stored; and
    a comparator circuit for comparing an address of the memory area specified by an input address with the fault address and when the input address corresponds to the fault address, selecting the corresponding relief memory area, wherein
    the comparator circuit selects the corresponding relief memory area upon receiving from the outside a relief memory area select signal indicative of selection of the relief memory area even when the address of the memory area specified by the address input does not correspond to the fault address stored in the fault address storing means.

2. An external controller which delivers a relief memory area select signal to each of a plurality of the semiconductor memory devices according to claim 1 comprising:
    a specific fault address storage for storing a specific fault address which specifies the fault memory area in each of the semiconductor memory devices to be replaced by the relief memory area stored in another semiconductor memory device;
    a comparator for comparing an input address with each of the specific fault address stored in the specific fault address storage and when the input address corresponds to the specific fault address, delivering the relief memory area select signal to the other semiconductor memory device which contains the corresponding relief memory area; and
    a select signal generator for delivering a chip select signal to the other semiconductor memory device which contains the corresponding relief memory area when the input address corresponds to the specific fault address.

3. A storage apparatus comprising a plurality of the semiconductor memory devices according to claim 1 and the external controller according to claim 2.

* * * * *